US009510107B2

(12) United States Patent
Dehe et al.

(10) Patent No.: US 9,510,107 B2
(45) Date of Patent: Nov. 29, 2016

(54) DOUBLE DIAPHRAGM MEMS MICROPHONE WITHOUT A BACKPLATE ELEMENT

(71) Applicant: Infineon Technologies AG, Neubiberg (DE)

(72) Inventors: Alfons Dehe, Reutlingen (DE); Marina Fekry Megally Bastarous, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 62 days.

(21) Appl. No.: 14/198,657

(22) Filed: Mar. 6, 2014

(65) Prior Publication Data
US 2015/0256940 A1    Sep. 10, 2015

(51) Int. Cl.
*H04R 19/04* (2006.01)
*H04R 19/00* (2006.01)
*B81C 1/00* (2006.01)

(52) U.S. Cl.
CPC ............ *H04R 19/04* (2013.01); *H04R 19/005* (2013.01); *B81B 2201/0257* (2013.01); *B81C 1/00182* (2013.01); *H04R 2201/003* (2013.01)

(58) Field of Classification Search
CPC ............... H04R 19/04; H04R 19/005; H04R 2201/003; B81C 1/00182; B81C 2201/0194; B81B 2201/0257
USPC ........... 381/58, 59, 335, 174, 175, 113, 116, 381/191, 181, 355, 358, 369; 257/414–416; 438/53, 48
See application file for complete search history.

(56) References Cited

U.S. PATENT DOCUMENTS

| | | | |
|---|---|---|---|
| 4,491,697 A * | 1/1985 | Tanaka et al. | 381/113 |
| 5,146,435 A * | 9/1992 | Bernstein | 367/181 |
| 6,075,867 A * | 6/2000 | Bay et al. | 381/191 |
| 6,295,365 B1 * | 9/2001 | Ota | 381/114 |
| 6,985,597 B2 * | 1/2006 | Akino | 381/174 |
| 7,620,191 B2 | 11/2009 | Tanabe et al. | |
| 7,826,629 B2 * | 11/2010 | Miles et al. | 381/172 |
| 7,888,840 B2 * | 2/2011 | Shimaoka et al. | 310/309 |
| 8,213,661 B2 * | 7/2012 | Hinke | 381/355 |

(Continued)

FOREIGN PATENT DOCUMENTS

| | | |
|---|---|---|
| CN | 1554210 A | 12/2004 |
| CN | 1802038 A | 7/2006 |

(Continued)

OTHER PUBLICATIONS

David Martin, Compliant Membranes for the Development of a MEMS Dual-Backplate Capacitive Microphone using the SUMMiT V Fabrication Process, Sandia Report, Nov. 2005, SAND2005-6787, Sandia National Laboratories.

*Primary Examiner* — Quoc D Tran
*Assistant Examiner* — Joshua Kaufman

(57) ABSTRACT

A sensor structure may include a first suspended structure and a second suspended structure disposed from the first suspended structure to form a volume. The first suspended structure and the second suspended structure may be arranged relative to each other such that a received pressure wave entering the volume between the first suspended structure and the second suspended structure generates a displacement of the first suspended structure to a first direction and a displacement of the second suspended structure to a second direction different from the first direction and the displacement may generate a measurable signal.

21 Claims, 18 Drawing Sheets

(56) References Cited

U.S. PATENT DOCUMENTS

| | | |
|---|---|---|
| 8,351,625 B2 | 1/2013 | Kasai |
| 8,582,788 B2 * | 11/2013 | Leidl et al. .................... 381/173 |
| 8,664,733 B2 * | 3/2014 | Rombach ...................... 257/416 |
| 8,861,764 B2 | 10/2014 | Tanaka et al. |
| 8,879,752 B2 * | 11/2014 | Harano et al. ................. 381/113 |
| 2003/0002129 A1 * | 1/2003 | Kobayashi et al. .......... 359/285 |
| 2003/0118203 A1 * | 6/2003 | Raicevich ..................... 381/174 |
| 2006/0140423 A1 | 6/2006 | Tanabe et al. |
| 2008/0192963 A1 | 8/2008 | Sato |
| 2009/0218642 A1 * | 9/2009 | Miller et al. .................. 257/416 |
| 2009/0309174 A1 * | 12/2009 | Fueldner et al. ............. 257/416 |
| 2010/0303274 A1 * | 12/2010 | Ryan et al. ................... 381/361 |
| 2012/0213400 A1 | 8/2012 | Kasai |
| 2013/0010981 A1 * | 1/2013 | Harano et al. ............... 381/94.1 |
| 2013/0070951 A1 | 3/2013 | Tanaka et al. |
| 2013/0108074 A1 * | 5/2013 | Reining ........................... 381/92 |
| 2014/0038335 A1 | 2/2014 | Merassi et al. |
| 2014/0301589 A1 * | 10/2014 | Greenwood et al. ......... 381/361 |
| 2014/0353780 A1 * | 12/2014 | Perletti et al. ................. 257/416 |
| 2015/0001647 A1 * | 1/2015 | Dehe et al. .................... 257/416 |
| 2015/0021722 A1 * | 1/2015 | Dehe et al. .................... 257/416 |
| 2015/0035094 A1 * | 2/2015 | Laermer et al. .............. 257/416 |

FOREIGN PATENT DOCUMENTS

| | | |
|---|---|---|
| CN | 101268714 A | 9/2008 |
| CN | 102771143 A | 11/2012 |
| CN | 102934464 A | 2/2013 |
| DE | 69615056 T2 | 4/2002 |
| DE | 102008058787 A1 | 5/2010 |
| JP | S64-073898 A | 3/1989 |
| JP | H09126920 A | 5/1997 |
| KR | 20120127622 A | 11/2012 |
| WO | 97/01258 A1 | 1/1997 |
| WO | 03024151 A1 | 3/2003 |
| WO | 2007024958 A2 | 3/2007 |
| WO | 2012/001589 A2 | 1/2012 |
| WO | 2013/021235 A1 | 2/2013 |

* cited by examiner

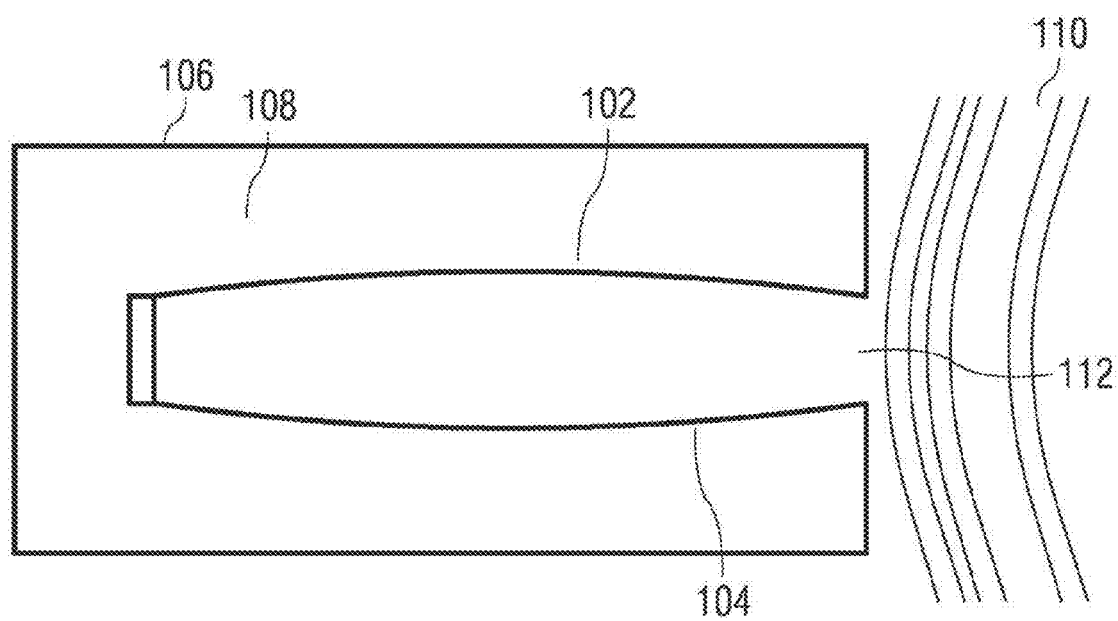

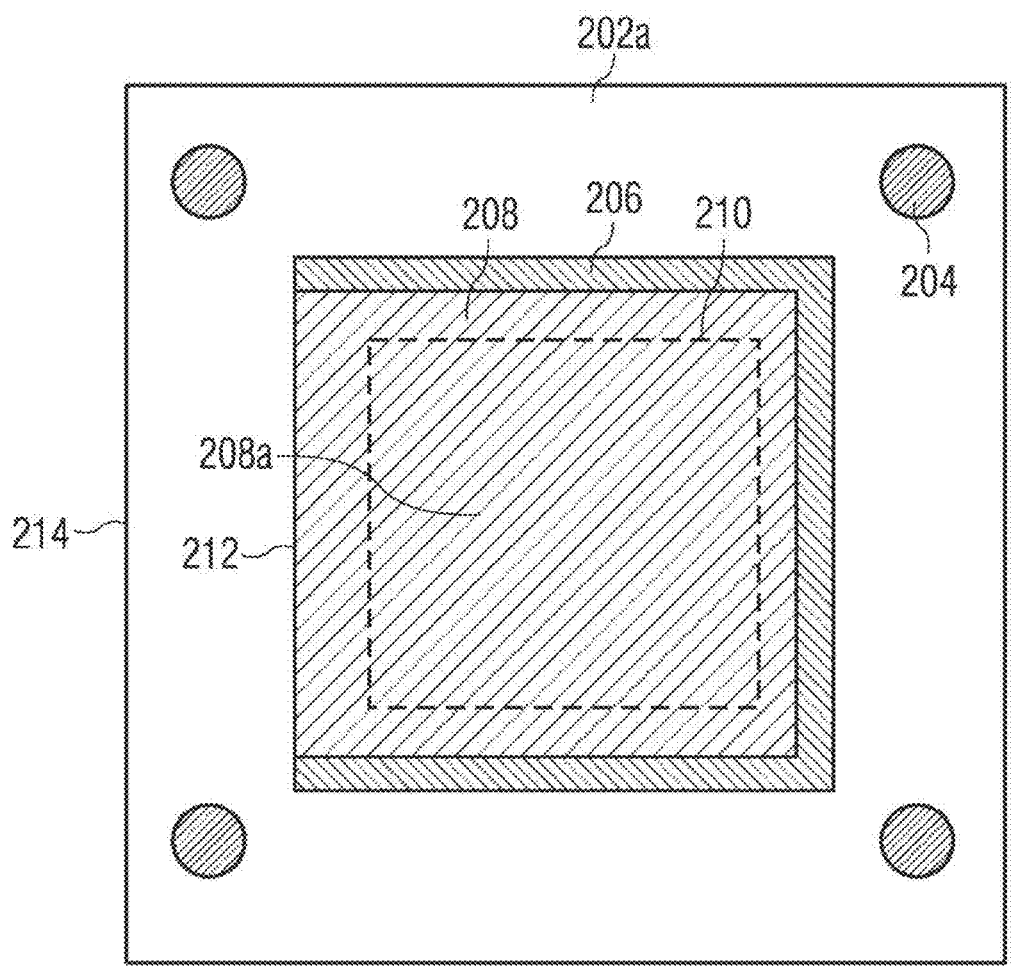

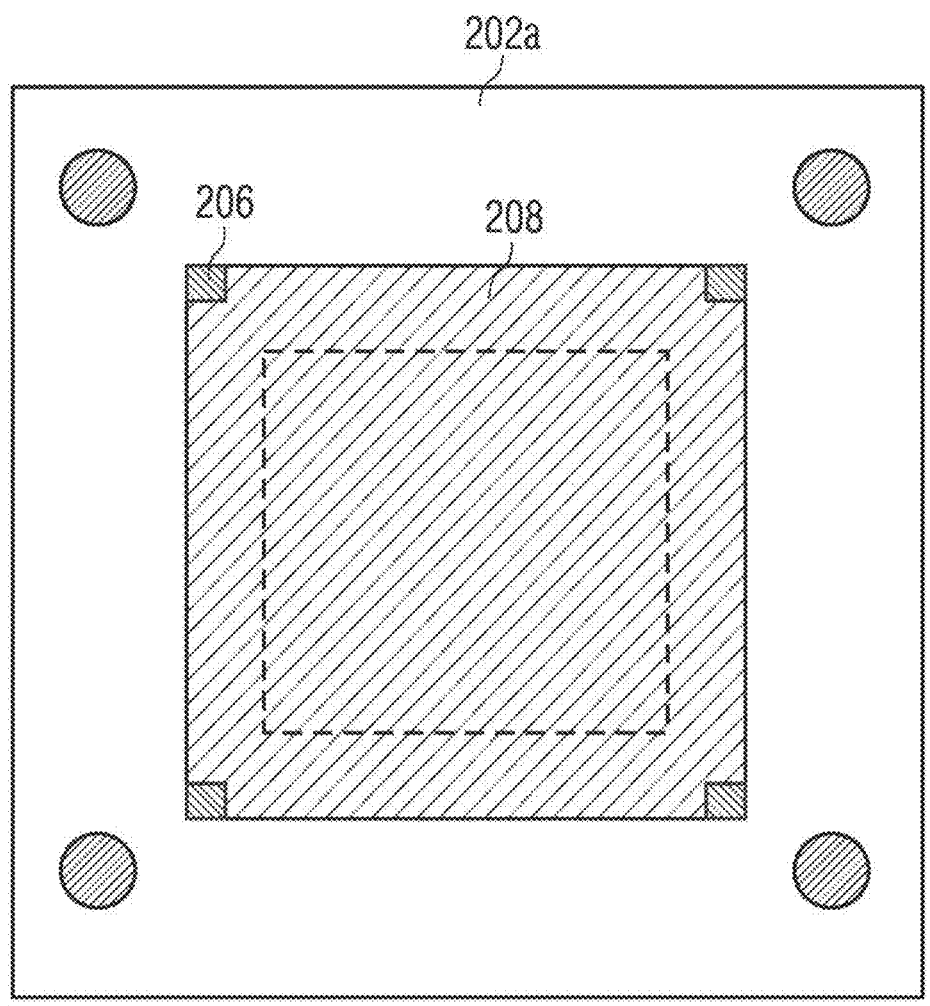

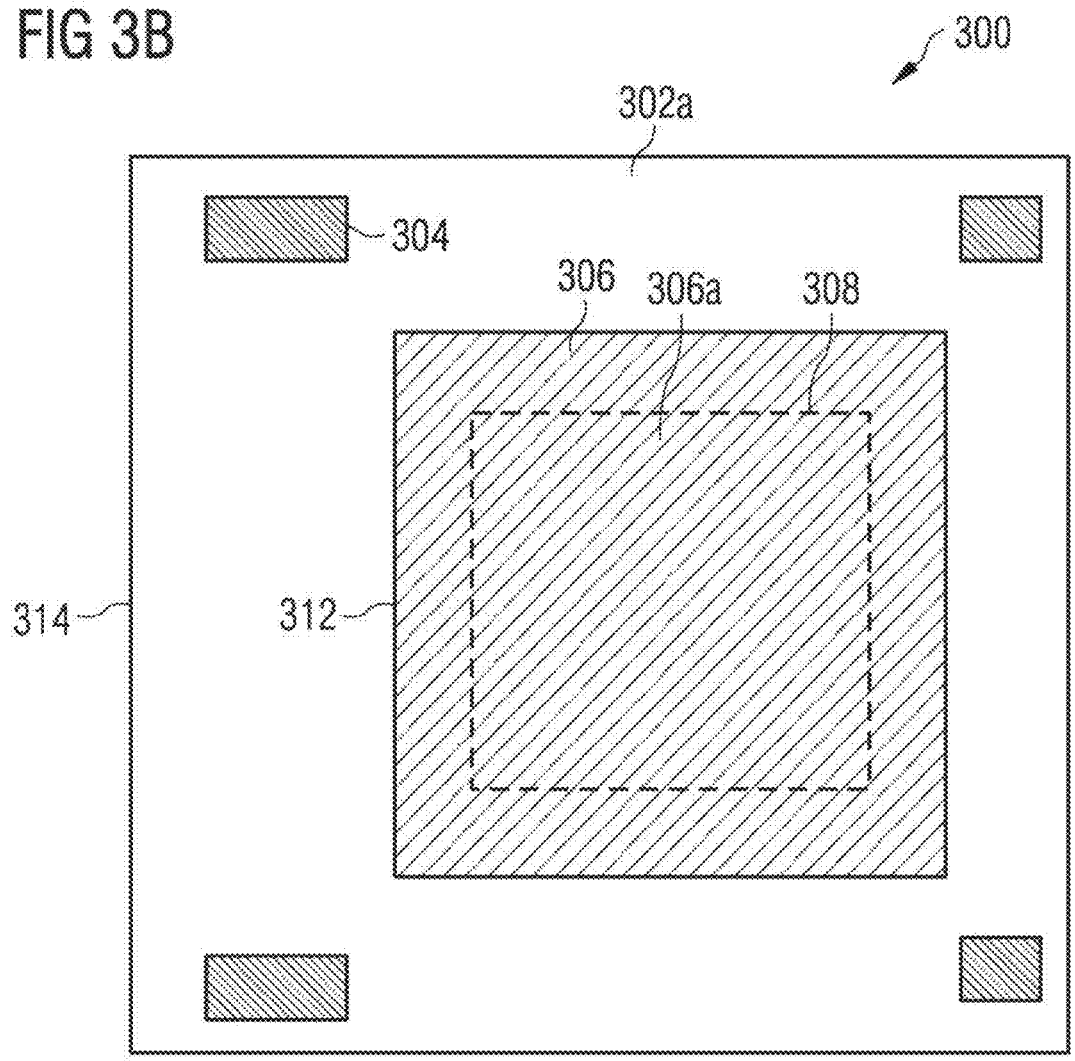

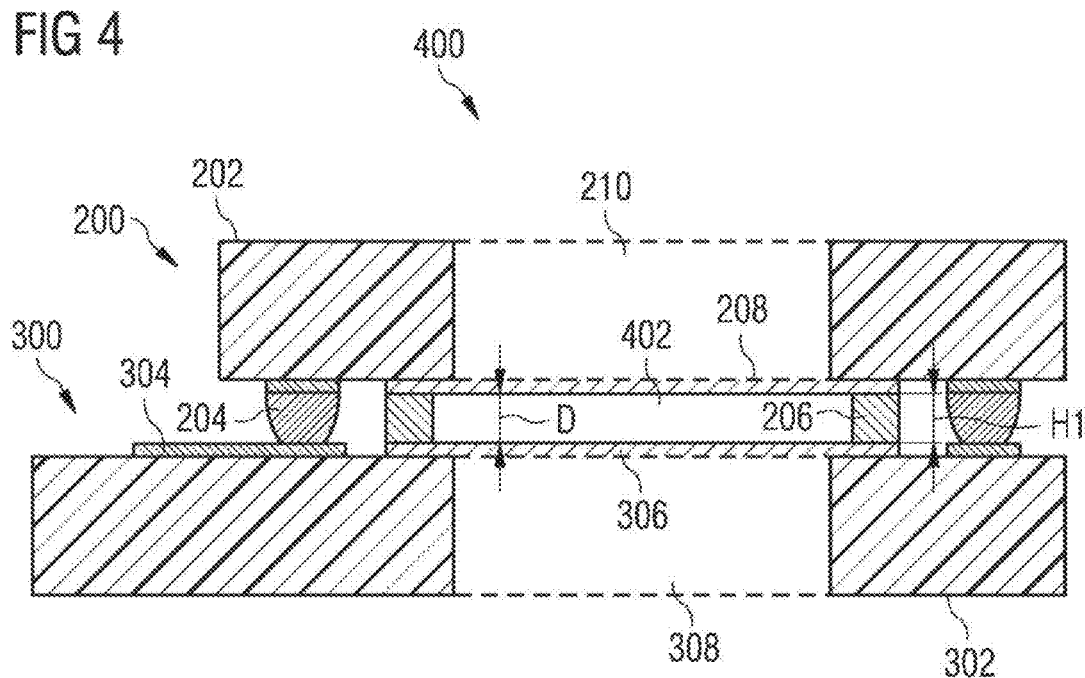

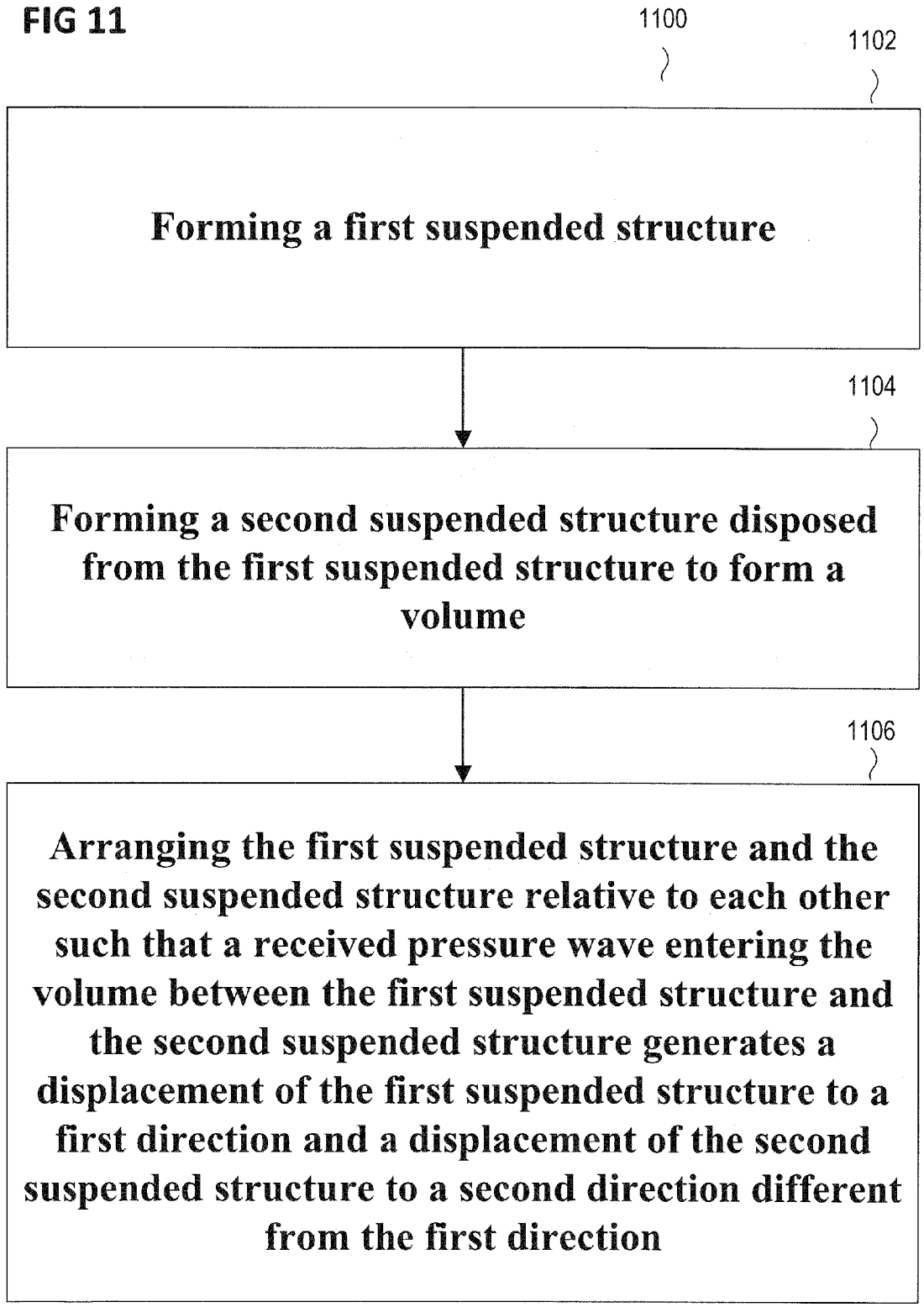

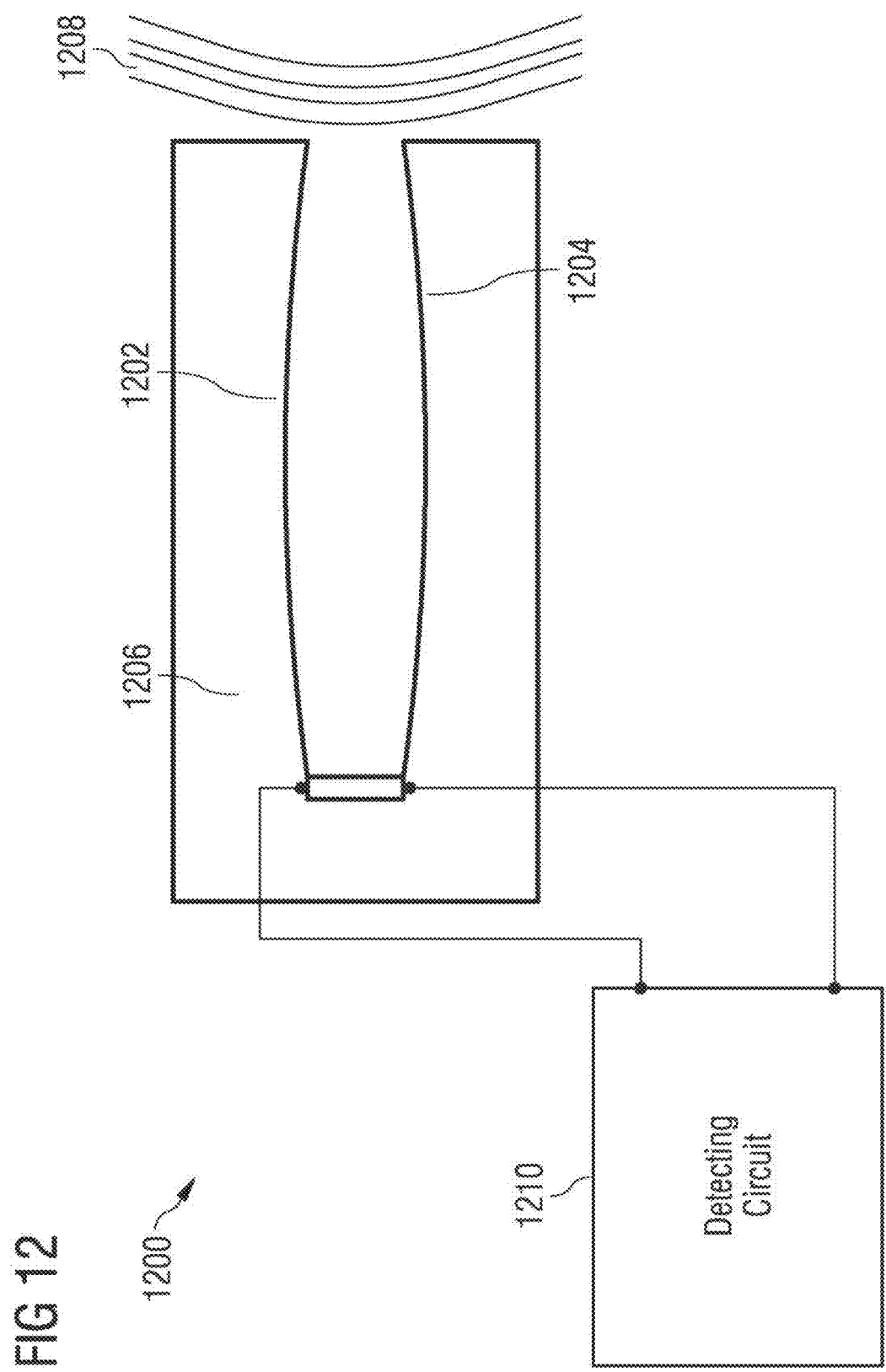

DOUBLE DIAPHRAGM MEMS MICROPHONE WITHOUT A BACKPLATE ELEMENT

TECHNICAL FIELD

Various embodiments relate generally to sensor structure containing a first suspended structure and a second suspended structure arranged to enclose a volume.

BACKGROUND

A microphone is, at a very basic level, a transducer that converts a pressure wave into an electrical signal. A conventional microphone has a diaphragm that is exposed to incident pressure waves. These pressure waves cause the diaphragm to deflect and this deflection is detected by a various transduction mechanisms and converted into an electric signal. In a micro-electro-mechanical system (MEMS) microphone, conventional transduction mechanisms may include piezoelectric, piezoresistive, optical, and capacitive mechanisms. A simple MEMS microphone may be a capacitor consisting of a counter electrode, more commonly referred to as a "backplate", and a diaphragm. When a voltage is applied across the backplate/diaphragm capacitive system, and sound waves cause the oscillation of the diaphragm, the sound waves can be converted into useable electrical signals by measuring the change in capacitance caused by the movement of the diaphragm relative to the backplate. MEMS microphones employing the capacitive driving principle typically have high sensitivity but they can be affected by electrical "noise" caused by parasitic capacitance from the backplate. One method of accomplishing increased sensitivity is the addition a second backplate on the side of the diaphragm opposite that of the first backplate. However, by adding a second backplate, the potential for noise is likewise increased.

SUMMARY

In various embodiments, a sensor structure is provided. The sensor structure may include a first suspended structure; a second suspended structure disposed from the first suspended structure to form a volume; wherein the first suspended structure and the second suspended structure are arranged relative to each other such that a received pressure wave entering the volume between the first suspended structure and the second suspended structure generates a displacement of the first suspended structure to a first direction and a displacement of the second suspended structure to a second direction different from the first direction.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 a perspective cross sectional view of a MEMS microphone;

FIG. 2B shows an overhead view of the MEMS structure represented in FIG. 2A in accordance with various embodiments;

FIG. 2C shows an overhead view of the MEMS structure represented in FIG. 2A in accordance with various embodiments;

FIG. 3B shows an overhead view of the MEMS structure represented in FIG. 3A in accordance with various embodiments;

FIG. 4 shows a cross-sectional view where the first MEMS structure represented in FIGS. 2A-2C and the second MEMS structure represented in FIGS. 3A & 3B have been fixed and/or joined to one another in accordance with various embodiments;

FIG. 11 is a flow diagram of a process for manufacturing the MEMS structures described above according to various embodiments;

FIG. 12 shows a perspective cross-sectional view of a double diaphragm sensor structure and a circuit configured to capacitively detect a deflection generated in at least one of the diaphragm structures by an incident pressure wave in accordance with various embodiments;

DESCRIPTION

Figure 2A:
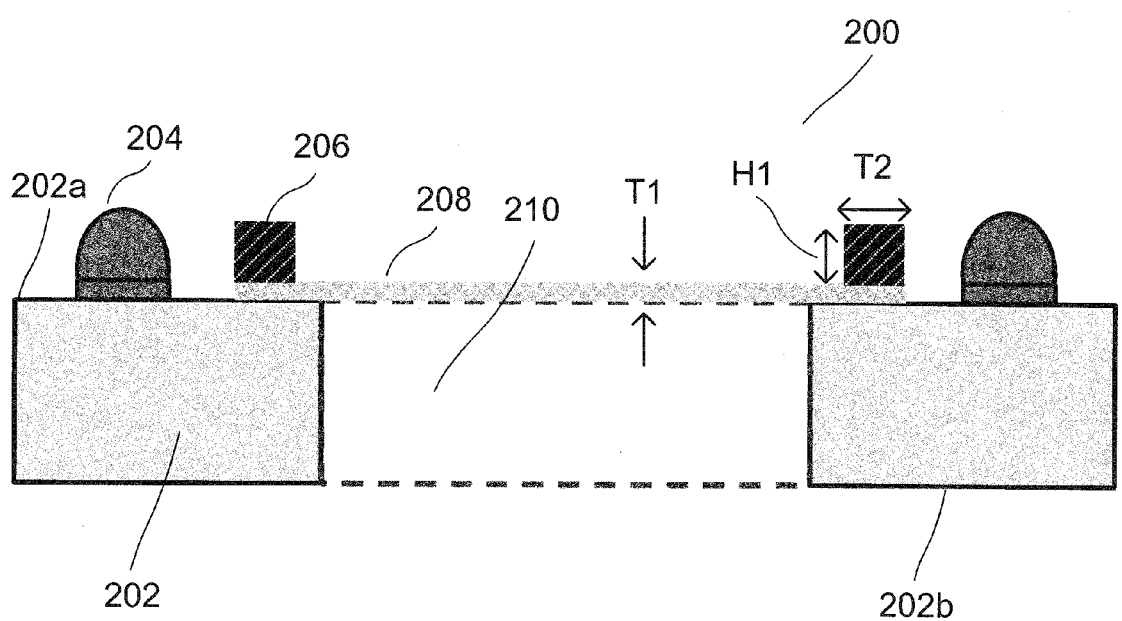
FIG. 2A shows a cross-sectional view of a first MEMS structure with a diaphragm element in accordance with various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

In accordance with the disclosure, a double diaphragm MEMS microphone without a backplate element is provided.

In various embodiments, a diaphragm may include a plate or a membrane. A plate may be understood as being a diaphragm being under pressure. Furthermore, a membrane may be understood as being a diaphragm being under tension. Although various embodiments will be described in more detail below with reference to a membrane, it may be alternatively provided with a plate, or in general with a diaphragm.

According to various embodiments, FIG. 1 is a cross-sectional, view of a MEMS microphone which may contain a housing 106, a back volume 108, and two membrane elements 102 and 104, respectively. According to various embodiments, sound waves 110 may enter portal 112, and may cause membrane elements 102 and 104 to oscillate in anti-phase with respect to each other. According to various embodiments, the signals generated by membranes 102 and 104 may then be compared by one or more processing circuitries (not shown) as may be desirable for a given application. The movement of both membranes 102 and 104 may result, according to various embodiments, in a doubled signal as compared to single membrane MEMS microphones. Further, in various embodiments, because a backplate element may not be necessary, the potential for parasitic capacitance due to the backplate may be substantially reduced The reduced parasitic capacitance when coupled with the increased signal from the double membrane structure, may substantially increase the signal-to-noise ratio of the microphone. Additionally, according to various embodiments, the improved signal-to-noise ratio may be further increased in the absence of a perforated backplate if the sound enters through a low impedance port in between the membranes.

According to various embodiments, as illustrated in FIG. 2A through FIG. 2C, the double-membrane MEMS microphone may include a first MEMS structure 200. MEMS structure 200 may include a first substrate 202 with a first void 210 formed in the first substrate 202 and a first membrane 208 suspended over the first void 210. According to various embodiments, MEMS structure 200 may further include at least one bump electrode 204 formed on a top surface 202a of the first substrate 202 and at least one spacer structure 206 formed over a portion of the first membrane 208.

According to various embodiments, the first substrate 202 may be a semiconductor substrate, such as a silicon substrate. Further, in various embodiments, the first substrate 202 may include or may be composed of other semiconductor materials such as germanium, silicon germanium, silicon carbide, gallium nitride, indium, indium gallium nitride, indium gallium arsenide, indium gallium zinc oxide, or other elemental and/or compound semiconductors (e.g. a III-V compound semiconductor such as e.g. gallium arsenide or indium phosphide, or a II-VI compound semiconductor or a ternary compound semiconductor or a quaternary compound semiconductor) as may be desired for a given application.

According to various embodiments, the first membrane 208 may be formed over at least a portion of the top surface 202a of first substrate 202 before the first void 210 is formed in first substrate 202. In various embodiments, the at least one spacer structure 206 may be formed over at least a portion of the first membrane 208. In other words, according to various embodiments, the first substrate 202, first membrane 208, and the at least one spacer structure 206 may be implemented as a layered structure. Said layer structure may then be etched from a the backside 202b (which may be the side of the first substrate 202 opposite the top surface 202a) of the first substrate 202 to form the first void 210. According to various embodiments, as the first substrate 202 is etched to form the first void 210, at least a portion of the first membrane 208 may be released from the first substrate 202 and become suspended across the first void 210. In other words, according to various embodiments, the first void 210 may be formed by etching the first substrate 202 from the backside 202b such that the first substrate 202 is etched through from the backside 202b to the top surface 202a of the first substrate 202 and the first membrane 208 may not be etched.

According to various embodiments, the first void 210 may be square or substantially square in shape. According to various embodiments, the first void 210 may be rectangular or substantially rectangular in shape. According to various embodiments, the first void 210 may be a circle or substantially circular in shape. According to various embodiments, the first void 210 may be an oval or substantially oval in shape. According to various embodiments, the first void 210 may be a triangle or substantially triangular in shape. According to various embodiments, the first void 210 may be a cross or substantially cross shaped. The first void 210 may be formed into any shape that may be desired for a given application.

The first void 210, may be shaped through various etching techniques, e.g. isotropic gas phase etching, vapor etching, wet etching, isotropic dry etching, plasma etching, etc.

According to various embodiments, the first membrane 208 may be formed over the top surface 202a of the first substrate 202 through various fabrication techniques, e.g. physical vapor deposition, electrochemical deposition, chemical vapor deposition, and molecular beam epitaxy.

According to various embodiments, the first membrane 208 may be square or substantially square shaped. According to various embodiments, the first membrane 208 may be rectangular or substantially rectangular in shape. According to various embodiments, the first membrane 208 may be a circle or substantially circular in shape. According to various embodiments, the first membrane 208 may be an oval or substantially oval in shape. According to various embodiments, the first membrane 208 may be a triangle or substantially triangular in shape. According to various embodiments, the first membrane 208 may be a cross or substantially cross-shaped. According to various embodiments, the first membrane 208 may be formed into any shape that may desired for a given application.

The first membrane 208 may be composed of or may include a semiconductor material such as, e.g. silicon. Further, the first membrane 208 may include or may be composed of other semiconductor materials such as germanium, silicon germanium, silicon carbide, gallium nitride, indium, indium gallium nitride, indium gallium arsenide, indium gallium zinc oxide, or other elemental and/or compound semiconductors (e.g. a III-V compound semiconductor such as e.g. gallium arsenide or indium phosphide, or a II-VI compound semiconductor or a ternary compound semiconductor or a quaternary compound semiconductor) as desired for a given application. The first membrane 208 may be composed of or may include at least one of a dielectric material, a piezoelectric material, a piezoresistive material, and a ferroelectric material.

According to various embodiments, a thickness T1 of the first membrane 208 may be, for example, from 300 nm to 5

μm, e.g. from 300 nm to 400 nm, e.g. from 400 nm to 500 nm, e.g. from 500 nm to 1 μm, e.g. from 1 μm to 3 μm, e.g. from 3 μm to 5 μm.

The at least one spacer structure 206 may be formed over at least a portion of the first membrane structure 208. By way of example, in various embodiments, the at least one spacer structure 206 may be formed over a portion of the first membrane 208 which may be anchored or fixed to the top surface 202a of the first substrate 200, e.g. a portion of the first membrane 208 which may not be suspended across the first void 210. According to various embodiments, the at least one spacer structure 206 may be formed along the perimeter of the first membrane 208 such that the at least one spacer structure 206 may at least partially surround and/or enclose an inner portion 208a (which may be a portion of the first membrane 208 which may be suspended across the first void 210) of the first membrane 208. According to various embodiments, the at least one spacer structure 206 may be implemented as post-like structures and formed at the vertices and/or corners of the first substrate 202. (depending on the geometrical shape of the first substrate 202 in a given embodiment) By way of example, as illustrated in FIG. 2C, the first substrate 202 may be a square or substantially square shaped and the at least one spacer structure 206 may be formed at the vertices and/or corners of the first substrate 202.

According to various embodiments, the at least one spacer structure 206 may have a height H1, in the range from about 1 μm to about 10 μm, e.g. in the range from about 2 μm to about 4 μm. According to various embodiments, the spacer structure(s) 206 may have a thickness T2, in the range from about 10 μm to about 100 μm, e.g. in the range from about 10 μm to about 20 μm.

According to various embodiments, the at least one spacer structure 206 may include or may be composed of, for example, various dielectrics, metals, and polymers as are desirable for a given application. The at least one spacer structure 206 may further include or may be composed of, for example, glass, and/or various polymers. The at least one spacer structure 206 may include or may be composed of any material desirable for a given application, for example a semiconductor material such as germanium, silicon germanium, silicon carbide, gallium nitride, gallium arsenide, indium, indium gallium nitride, indium gallium arsenide, indium gallium zinc oxide, or other elemental and/or compound semiconductors.

According to various embodiments, the at least one bump electrode 204 may be formed on a portion of the top surface 202a of substrate 202 that may at least partially surround and/or enclose the first void 210. By way of example, as illustrated in FIG. 2B, according to various embodiments, the at least one bump electrode 204 may be formed at an edge region of the top surface 202a of the first substrate 202, e.g. between an outer edge 212 of the first void 210 (which may be an edge of the void 210 that defines the perimeter of the first void 210) and an outer edge 214 (which may be an edge of the top surface 202a that defines the perimeter of the top surface 202a) of the top surface 202a of the first substrate 202.

The at least one bump electrode 204 may be formed through patterning and deposition techniques, such as e.g. through an electrolytic plating process, a photolithography process, and by the so-called "ball bump" method. According to various embodiments, the at least one bump electrode 204 may be formed of a conductive material such as metal. For example, according to various embodiments, the at least one bump electrode 204 may be composed of or may include copper, nickel, tin, lead, silver, gold, aluminum, and various alloys of these metals such as e.g. cupronickel, nickel-aluminum, etc. According to various embodiments, the at least one bump electrode 204 may be composed of or may include a solder bump. Further, according to various embodiments, the at least one bump electrode 204 may include or may be composed of other materials which may be desirable for a given application.

According to various embodiments, the first membrane 208 may be electrically coupled to the at least one bump electrode 204 by various electrical leads and vias (not shown) which may be formed in or on the first substrate 202.

Figure 3A:
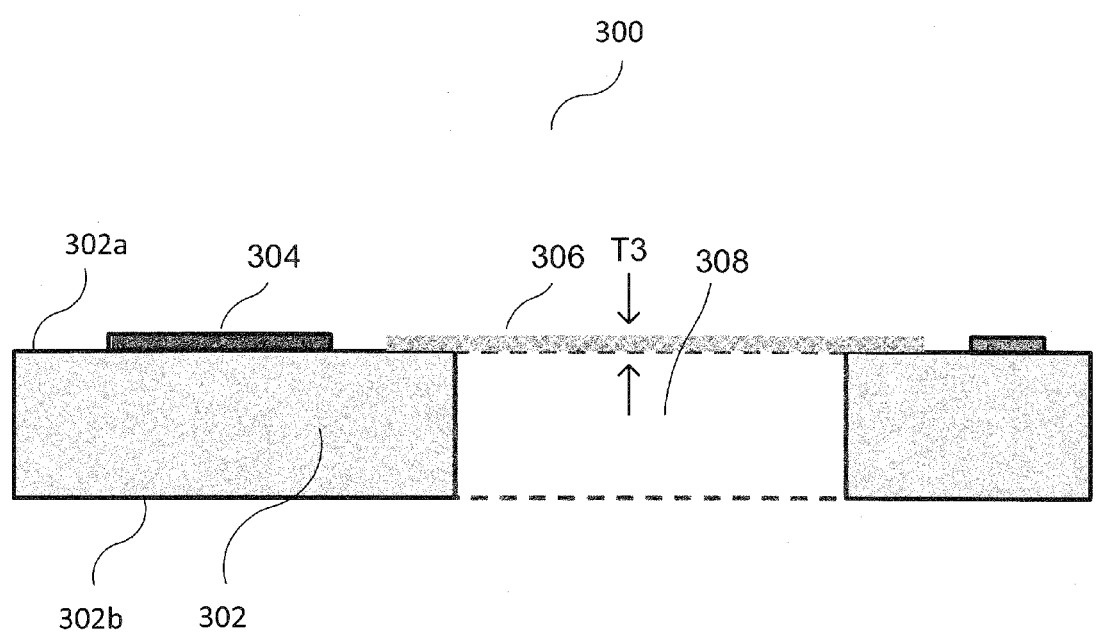
FIG. 3A shows a cross-sectional view of a second MEMS structure with a diaphragm element in accordance with various embodiments.

According to various embodiments, as illustrated in FIG. 3, the double-membrane MEMS microphone may include a second MEMS structure 300. The MEMS structure 300 may include a second substrate 302 with a second void 308 formed in the second substrate 302 and a second membrane 306 suspended over the second void 308. According to various embodiments, the MEMS structure 300 may further include at least one contact pad 304 formed on a top surface 302a of the second substrate 302.

The second substrate 302 may be a semiconductor substrate, such as a silicon substrate. Further, the second substrate 302 may include or may be composed of other semiconductor materials such as germanium, silicon germanium, silicon carbide, gallium nitride, indium, indium gallium nitride, indium gallium arsenide, indium gallium zinc oxide, or other elemental and/or compound semiconductors (e.g. a III-V compound semiconductor such as e.g. gallium arsenide or indium phosphide, or a II-VI compound semiconductor or a ternary compound semiconductor or a quaternary compound semiconductor) as desired for a given application.

The second membrane 306 may be formed over at least a portion of the top surface 302a of the second substrate 302 before the second void 308 is formed in the second substrate 302. In other words, according to various embodiments, the second substrate 302 and the second membrane 306 may be implemented as a layered structure. The layer structure may then be etched from a backside 302b (which may be the side of the second substrate 302 opposite the top surface 302a) of the second substrate 302 to form the second void 308. According to various embodiments, as the second substrate 302 is etched to form the second void 308, at least a portion of the second membrane 306 may be released from the second substrate 302 and become suspended across the second void 308. In other words, according to various embodiments, the second void 308 may be formed by etching the second substrate 302 from the backside 302b such that the second substrate 302 is etched through from the backside 302b to the top surface 302a of the second substrate 302 without etching the second membrane 306. The second void 308 may be formed in the second substrate 302 such that the second void may not be geometrically centered in the top surface 302a of the second substrate 302. In other words, according to various embodiments, the portion of the second substrate 302 which may surround and/or enclose the second void 308 may not be symmetrical.

According to various embodiments, the second void 308 may be square or substantially square in shape. According to various embodiments, the second void 308 may be rectangular or substantially rectangular in shape. According to various embodiments, the second void 308 may be a circle or substantially circular in shape. The second void 308 may be an oval or substantially oval in shape. According to various embodiments, the second void 308 may be a triangle or substantially triangular in shape. According to various embodiments, the second void 308 may be a cross or substantially cross shaped. The second void 308 may be formed into any shape that may desired for a given application.

According to various embodiments, the second void 308 may be shaped through various etching techniques, e.g. isotropic gas phase etching, vapor etching, wet etching, isotropic dry etching, plasma etching, etc.

According to various embodiments, the second membrane 306 may be formed over the top surface 302a of the second substrate 302 through various fabrication techniques, e.g. physical vapor deposition, electrochemical deposition, chemical vapor deposition, and molecular beam epitaxy.

According to various embodiments, the second membrane 306 may be square or substantially square shaped. The second membrane 306 may be rectangular or substantially rectangular in shape. The second membrane 306 may be a circle or substantially circular in shape. According to various embodiments, the second membrane 306 may be an oval or substantially oval in shape. According to various embodiments, the second membrane 306 may be a triangle or substantially triangular in shape. The second membrane 306 may be a cross or substantially cross-shaped. The second membrane 306 may be formed into any shape that may desired for a given application.

The second membrane 306 may be composed of or may include a semiconductor material such as, e.g. silicon. Further, the second membrane 306 may include or may be composed of other semiconductor materials such as germanium, silicon germanium, silicon carbide, gallium nitride, indium, indium gallium nitride, indium gallium arsenide, indium gallium zinc oxide, or other elemental and/or compound semiconductors (e.g. a III-V compound semiconductor such as e.g. gallium arsenide or indium phosphide, or a II-VI compound semiconductor or a ternary compound semiconductor or a quaternary compound semiconductor) as desired for a given application. The second membrane 306 may be composed of or may include at least one of a dielectric material, a piezoelectric material, a piezoresistive material, and a ferroelectric material.

According to various embodiments, a thickness T3 of the second membrane 306 may be, for example, from 300 nm to 5 μm, e.g. from 300 nm to 400 nm, e.g. from 400 nm to 500 nm, e.g. from 500 nm to 1 μm, e.g. from 1 μm to 3 μm, e.g. from 3 μm to 5 μm.

According to various embodiments, the at least one contact pad 304 may be formed on a portion of the top surface 302a of the second substrate 302 that may at least partially surround and/or enclose the second void 308. By way of example, as illustrated in FIG. 3B, the at least one contact pad 304 may be formed at an edge region of the top surface 302a of the first substrate 302, e.g. between an outer edge 312 of the second void 308 (which may be an edge of the second void 308 that defines the perimeter of the second void 308) and an outer edge 314 (which may be an edge of the top surface 302a that defines the perimeter of the top surface 302a) of the top surface 302a of the second substrate 302.

The at least one contact pad 304 may be formed through various patterning and deposition techniques, such as e.g. through an electrolytic plating process or a photolithography process. According to various embodiments, the at least one contact pad 304 may be formed of a conductive material such as metal. For example, the at least one contact pad 304 may be composed of or may include copper, nickel, tin, lead, silver, gold, aluminum, and various alloys of these metals such as e.g. cupronickel, nickel-aluminum, etc. Further, the at least one contact pad 304 may include or may be composed of other materials which may be desirable for a given application.

According to various embodiments, the second membrane 306 may be electrically coupled to the at least one contact pad 304 by various electrical leads and vias (not shown) which may be formed in or on the second substrate 302.

According to various embodiments, as illustrated in FIG. 4, the first MEMS structure 200 and the second MEMS structure 300 may be arranged to form a dual MEMS structure 400. The first MEMS structure 200 and the second MEMS structure 300 may be arranged such that the top surface 202a of the first substrate 202 and the top surface 302a of the second substrate 302 are substantially parallel to each other. The first substrate 202 and the second substrate 302 may be arranged so that they at least partially overlap. According to various embodiments, at least a portion of the first substrate 202 may be suspended over and/or above at least a portion of the second substrate 302. At least a portion of the second substrate 302 may extend beyond (e.g. not be overhung by) the first substrate 202.

According to various embodiments, the dual MEMS structure 400 may be formed by fixing and/or attaching the at least one contact pad 304 to the at least one bump electrode 204. The at least one contact pad 304 may be electrically coupled to the at least one bump electrode 204. For example, the at least one contact pad 304 may be fixed to the at least one bump electrode 204 through various soldering techniques.

The at least one spacer structure 206 may be arranged between the first membrane 208 and the second membrane 306. The at least one spacer structure 206 may be connected and/or fixed to a surface of the second membrane 306. The height H1 of the at least one spacer structure 206 may be a distance D, which may be the distance that the first membrane 208 is disposed from the second membrane 306.

According to various embodiments the first membrane 208 and the second membrane 306 may at least partially enclose a receiving volume 402. The at least one spacer structure 206 may be arranged between the first membrane 208 and the second membrane 306 to further enclose the receiving volume 402.

According to various embodiments, as illustrated in FIG. 5 to FIG. 10, the dual MEMS structure 400 may be attached to a surface of a support structure 508. The backside 302b of the second substrate 302 may be attached to a top surface 508a of the support structure 508.

According to various embodiments, a covering layer 506 may be attached to the support structure 508. The covering layer 506 may encapsulate and/or enclose the dual MEMS structure 400. The covering layer 506 may include or may be composed of a material which may be desirable for a given application, for example various polymer materials, such as a composite thermosetting plastic (e.g. duroplast or thermoplast). According to various embodiments, the covering layer 506 may be composed of metal, such as stainless steel, or may include a metal layer for providing electrostatic shielding. According to various embodiments, the covering layer 506 may be composed or may include a laminate based lid consisting of a laminate frame and a laminate top layer and may include a metal layer or layers for electrostatic shielding. The covering layer 506 may have a thickness T4, in the range from about 50 μm to about 500 μm, e.g. in the range from about 100μ to about 200 μm.

According to various embodiments, the covering layer 506 may have at least one passage hole 510. The at least one passage hole 510 may be arranged to allow the receiving volume 402 to communicate with the atmosphere outside of the covering layer 506.

Figure 5A:
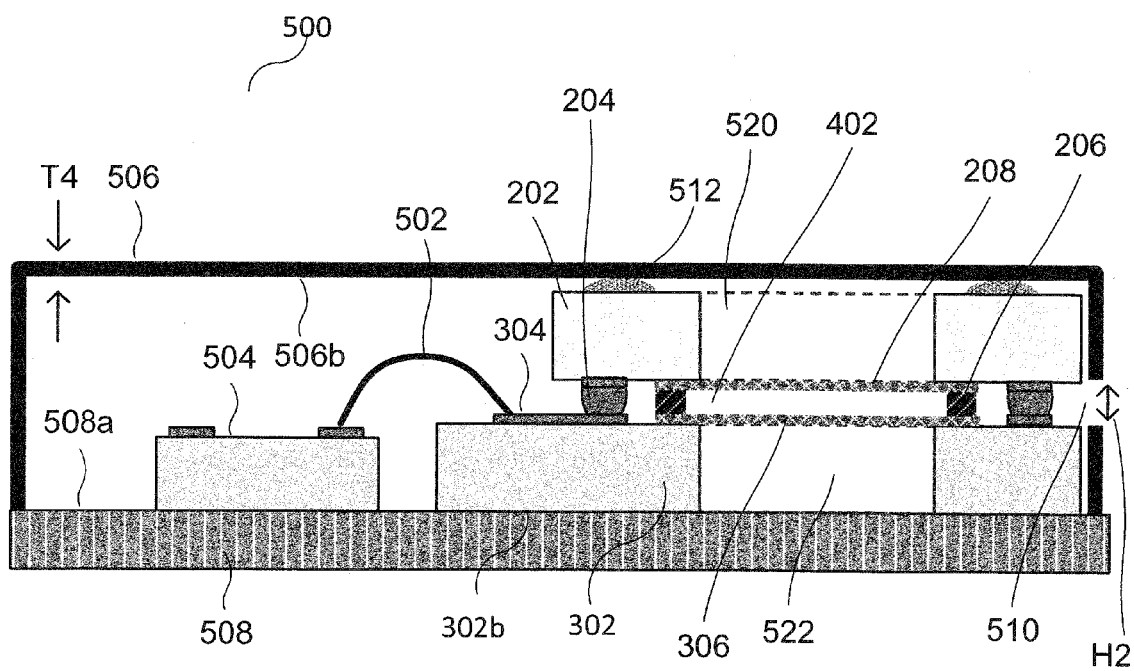
FIGS. 5A & 5B show the dual MEMS structure from FIG. 4 in accordance with various embodiments.
Figure 5B:
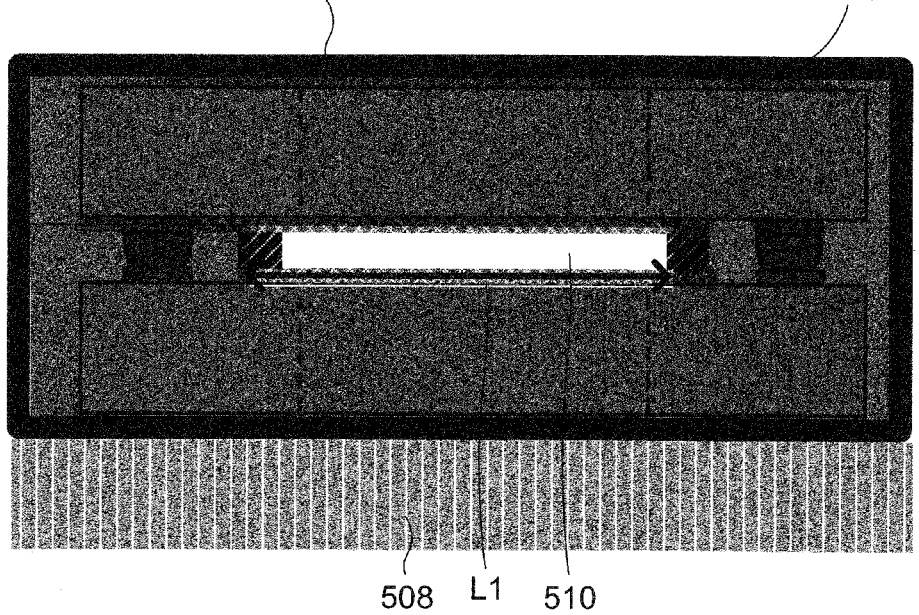

According to various embodiments, as illustrated in FIG. 5 and B, the at least one passage hole 510 may be rectangular or substantially rectangular in shape with height H2 in the range from about 20 μm to about 200 μm, e.g. from about 50 μm to about 150 μm and a length L1 in the range from about 200 μm to about 2000 μm, e.g. from about 100 μm to about 1000 μm.

According to various embodiments, the at least one passage hole 510 may be a circle or substantially circular in shape, with a diameter in the range from about 100 μm to about 1000 μm, e.g. from about 200 μm to about 500 μm.

According to various embodiments, the at least one passage hole 510 may be an oval or substantially oval in shape. According to various embodiments, the at least one passage hole 510 may be a triangle or substantially triangular in shape. According to various embodiments, the at least one passage hole 510 may be a cross or substantially cross shaped. According to various embodiments, the at least one passage hole 510 may be formed into any shape that may desired for a given application.

According to various embodiments, the at least one passage hole 510 may be provided through a portion of the covering layer 506 that is substantially perpendicular to the top surface 508a of the support structure 508.

According to various embodiments, the covering layer 506 may be arranged relative to first MEMS structure 200 such that the first void 210 is enclosed by the covering layer 506 to form a first back-volume 520.

According to various embodiments, an interior surface 506b of the covering layer 506 may be separated and/or spatially offset from the dual MEMS structure 400.

According to various embodiments, an interior surface 506b of the covering layer 506 may be fixed and/or attached to the backside 202b of the first substrate 202 to form the first back-volume 520.

According to various embodiments, an interior surface 506b of the covering layer 506 may be separated and/or spatially offset from the backside 202b of the first substrate 202. A sealing layer 512 may be arranged between the interior surface 506b of the covering layer 506 and the backside 202b of the first substrate 202 to enclose the first void 210 and form the first back-volume 520.

Figure 7A:
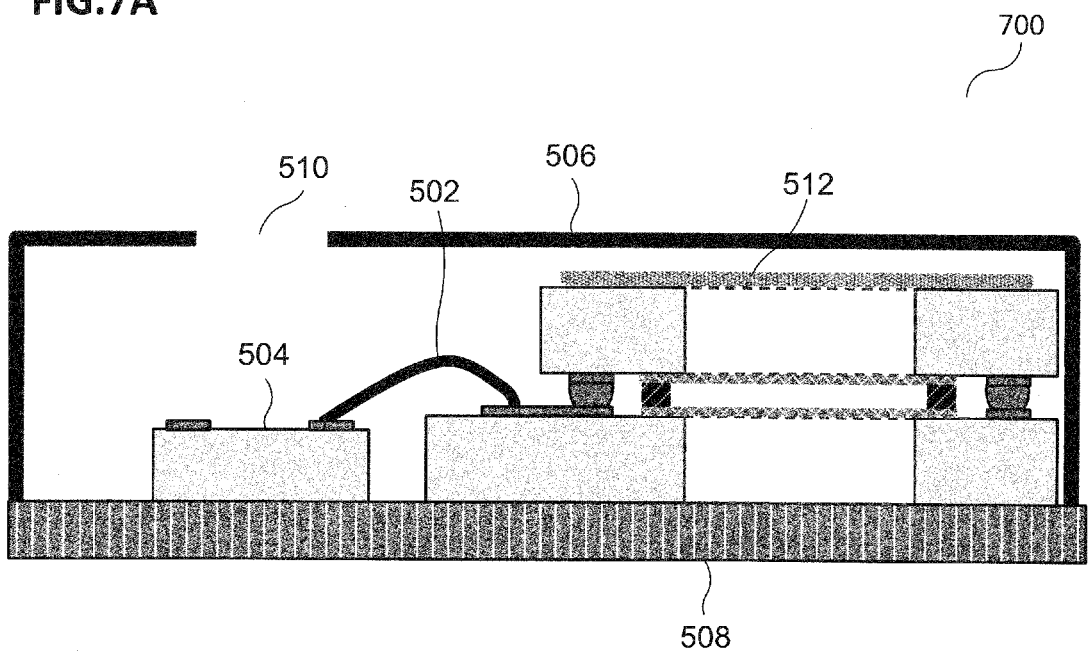
FIGS. 7A & 7B show the dual MEMS structure from FIG. 4 in accordance with various embodiments.
Figure 7B:
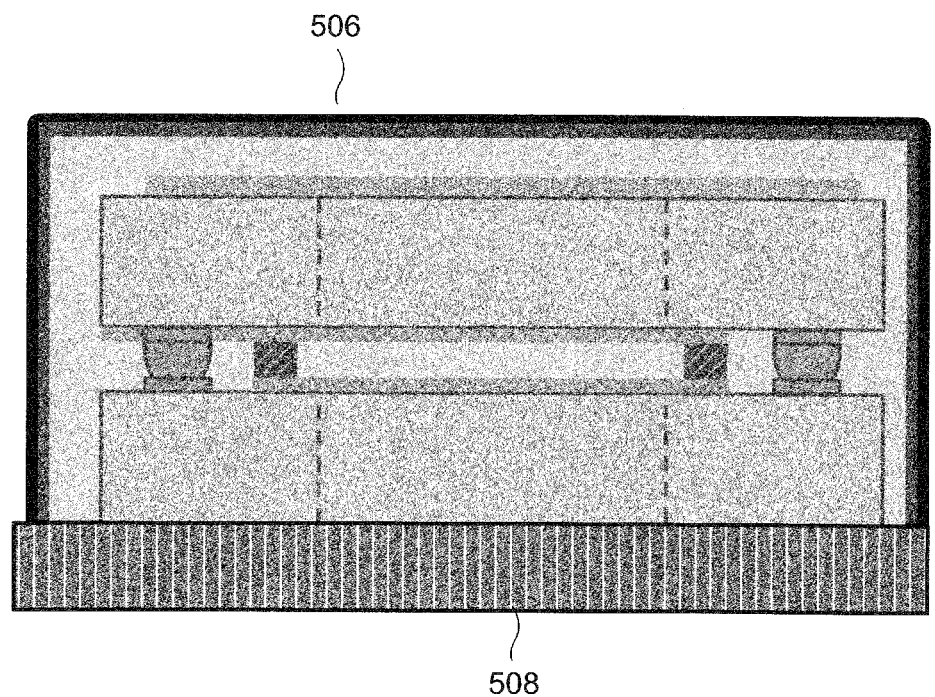

According to various embodiments, as illustrated in FIG. 7A and FIG. 7B, the sealing layer 512 may be attached to the backside 202b of the first substrate 202 and may span and/or be suspended across the first void 210 to form the first back-volume 520.

According to various embodiments, the sealing layer 512 may be or may include various adhesives, sealants, and epoxies as may be desirable for a given application, for example a conductive or nonconductive epoxy, or a silicone based glue. According to various embodiments, the sealing layer 512 may be or may include various adhesive foils or other materials which may be fixed and/or attached such as e.g. by an adhesive, to the backside 202b of the first substrate 202. The sealing layer 512 may have a thickness as may be desirable for a given application, for example, in the range from about 5 μm to about 50 μm, e.g. in the range from about 10 μm to about 20 μm.

According to various embodiments, the support structure 508 may include or may be composed of a material which may be desirable for a given application, for example a semiconductor material such as germanium, silicon germanium, silicon carbide, gallium nitride, gallium arsenide, indium, indium gallium nitride, indium gallium arsenide, indium gallium zinc oxide, or other elemental and/or compound semiconductors. According to various embodiments, the support structure 508 may also include other materials or combinations of material, for example various dielectrics, metals, and polymers as are desirable for a given application. The support structure 508 may further include or may be composed of, for example, glass, and/or various polymers. The support structure 508 may be a silicon-on-insulator (SOI) structure. The support structure 508 may be a printed circuit board.

According to various embodiments, the support structure 508 may be arranged relative to the second MEMS structure 300 to further enclose the second void 308 and thereby form a second back-volume 522.

According to various embodiments, as illustrated in FIG. 5 to FIG. 10, a further structure 504 may be attached to a surface of a support structure 508. The further structure 504 may be an application-specific integrated circuit (ASIC). For example, the further structure 504 may be or may include a comparator circuit for comparing a signal generated by the first membrane 208 and a signal generated by the second membrane 306, e.g. a signal caused by a deflection of the first membrane 208 and a signal caused by a deflection of the second membrane 306.

According to various embodiments, the further structure 504 may be connected and/or coupled to the dual MEMS structure 400. The further structure 504 may be electrically connected to the at least one contact pad 304 by an at least one connection wire 502.

Figure 6A:
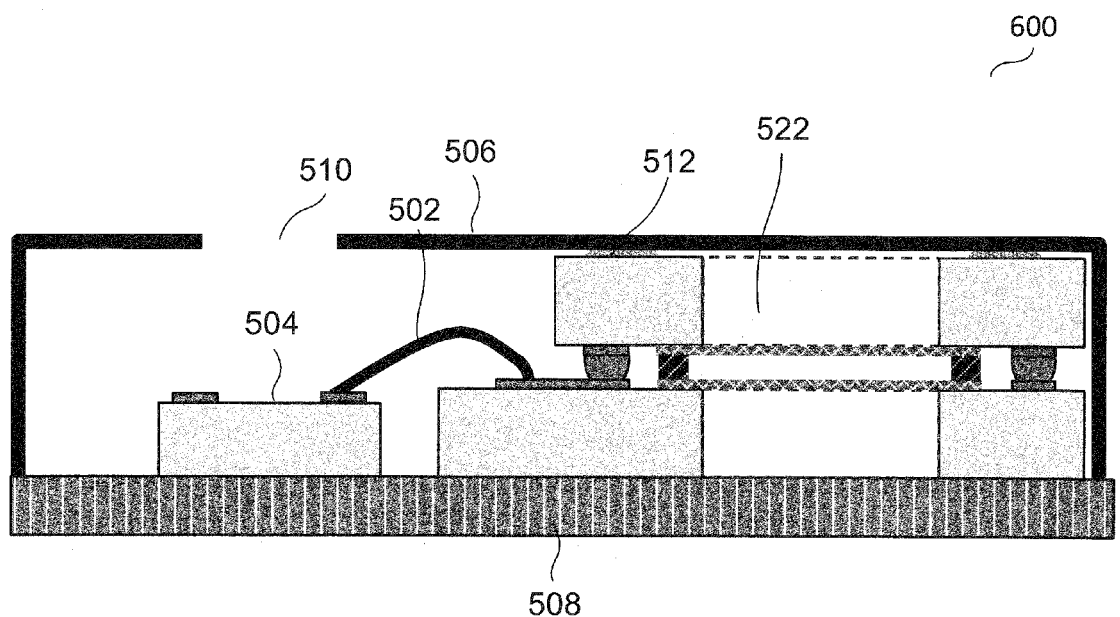
FIGS. 6A & 6B show the dual MEMS structure from FIG. 4 in accordance with various embodiments.
Figure 6B:
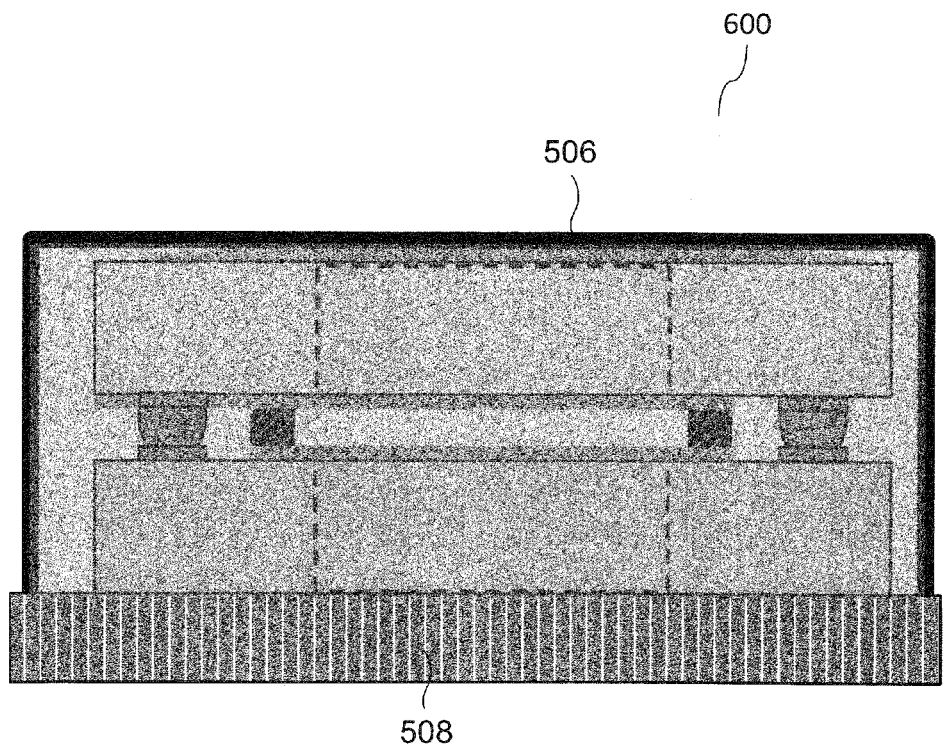

According to various embodiments, as illustrated in FIGS. 6A and 6B, the at least one passage hole 510 may be provided through a portion of the covering layer 506 that is substantially parallel to the top surface 508a of the support structure 508.

Figure 8A:
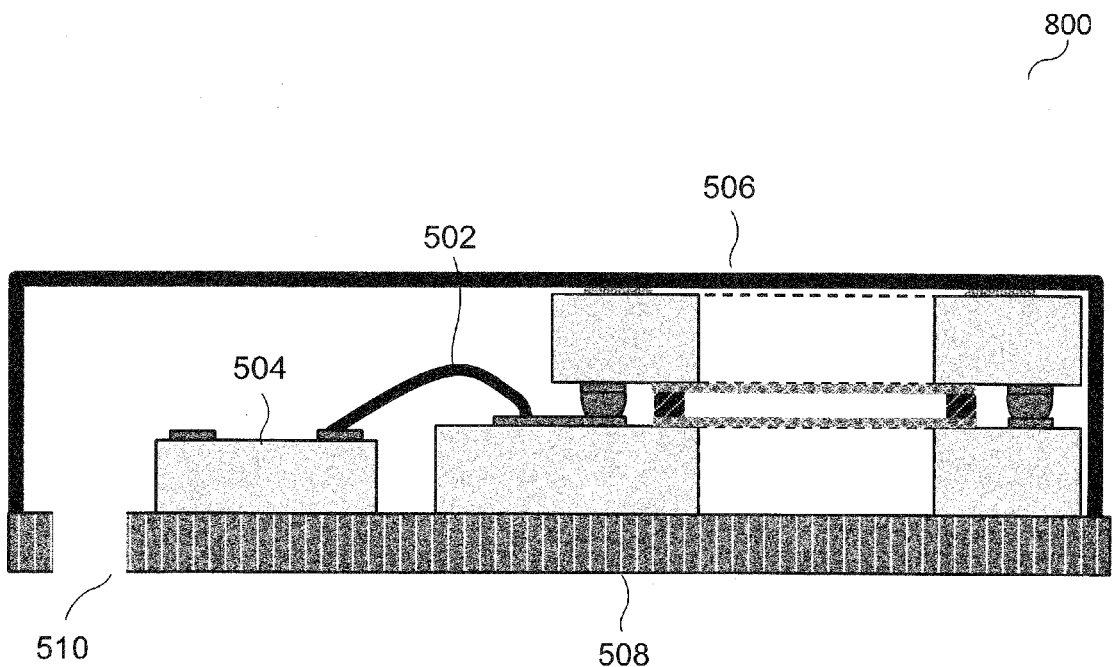
FIGS. 8A & 8B show the dual MEMS structure from FIG. 4 in accordance with various embodiments.
Figure 8B:
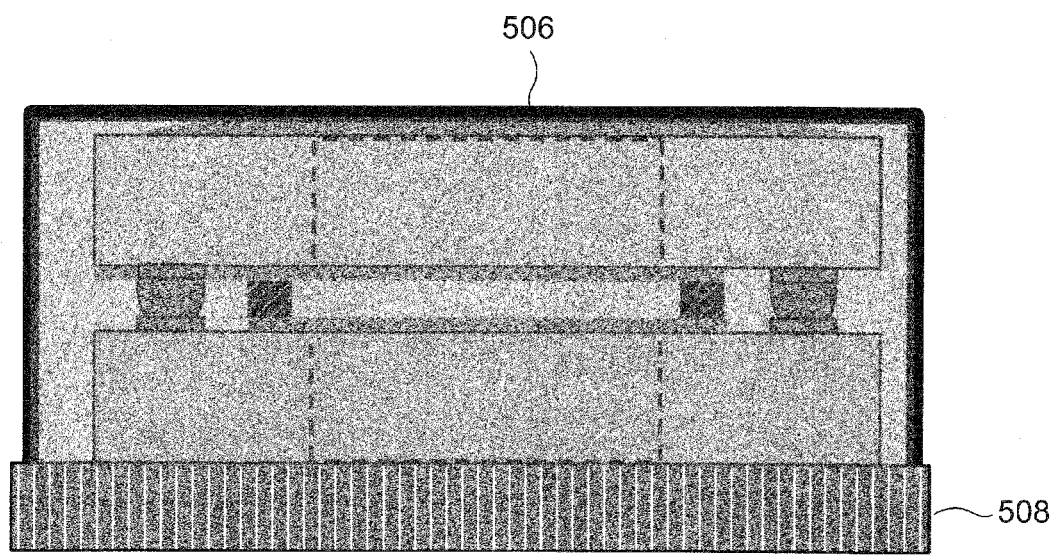
Figure 9A:
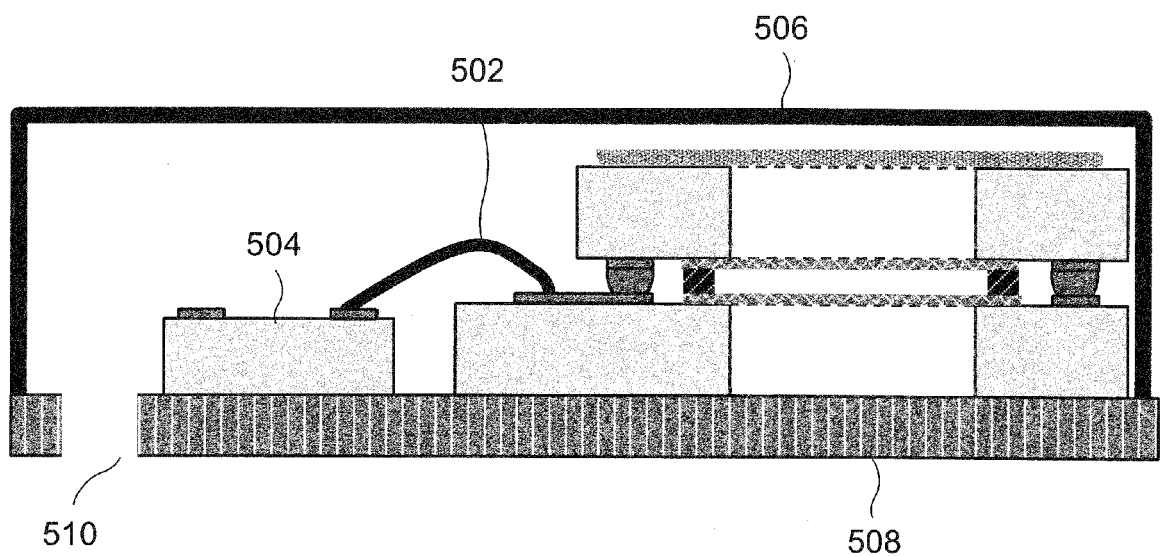
FIGS. 9A & 9B show the dual MEMS structure from FIG. 4 in accordance with various embodiments.
Figure 9B:
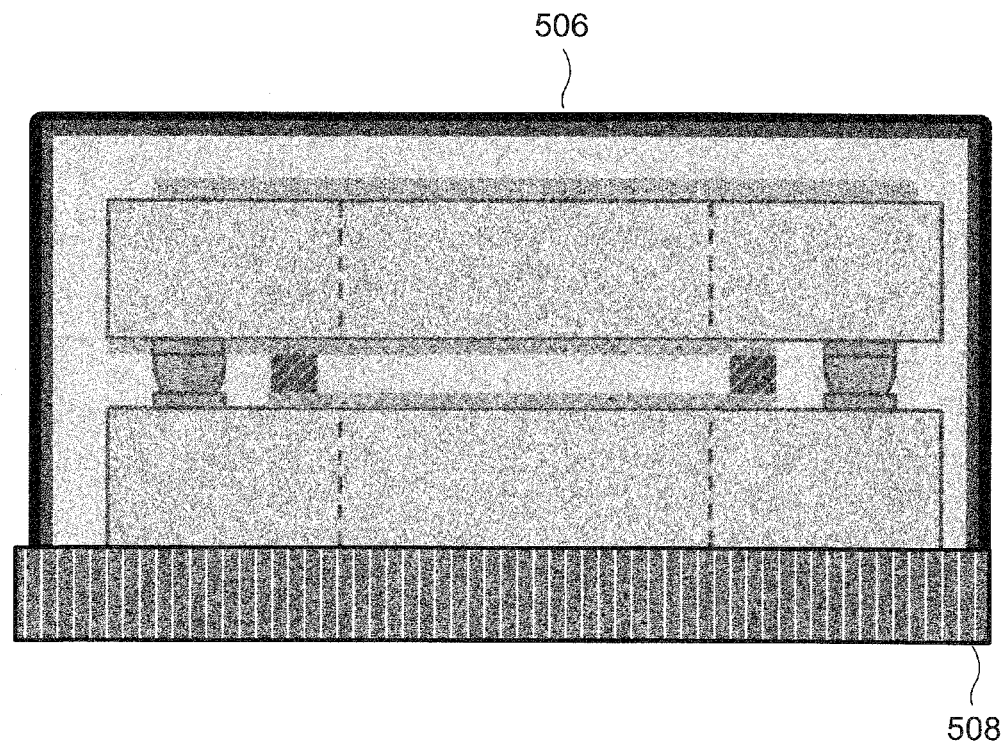
Figure 10A:
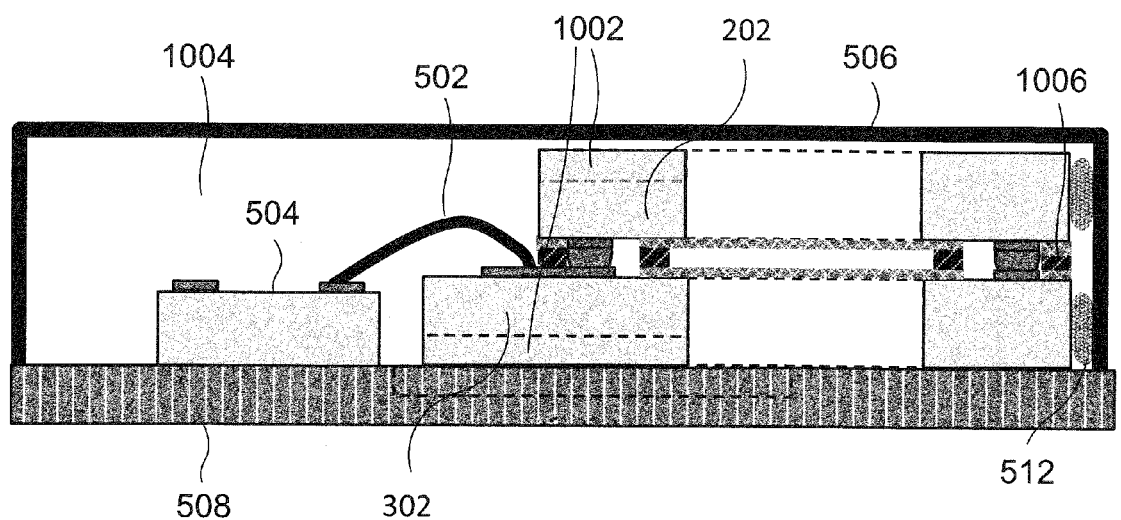
FIGS. 10A through 10D show the dual MEMS structure from FIG. 4 in accordance with various embodiments.
Figure 10B:
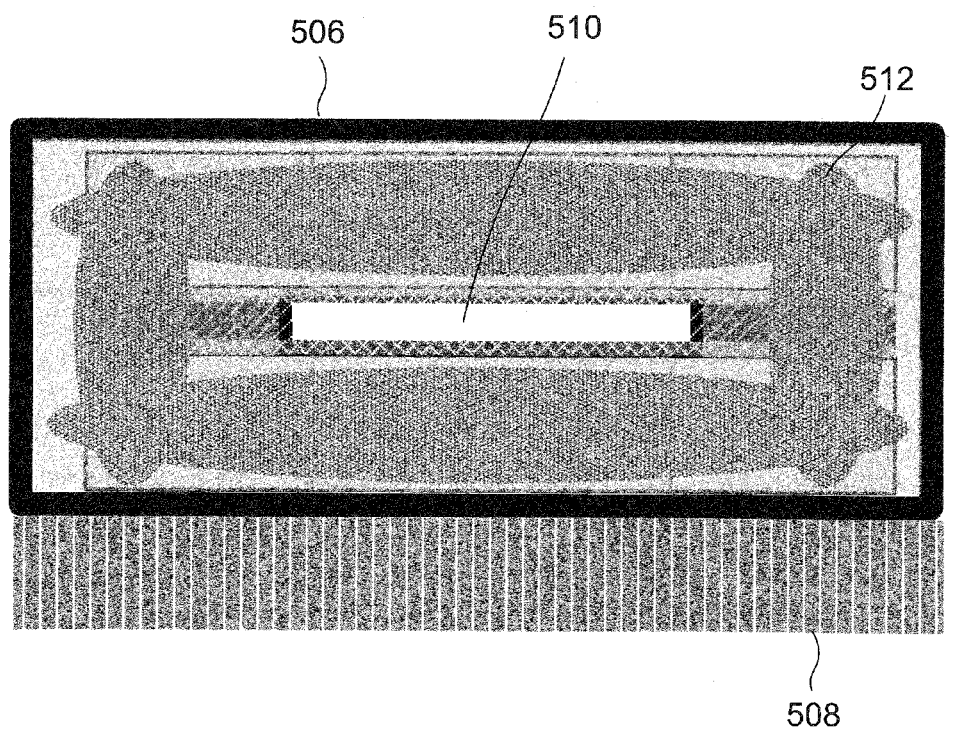
Figure 10C:
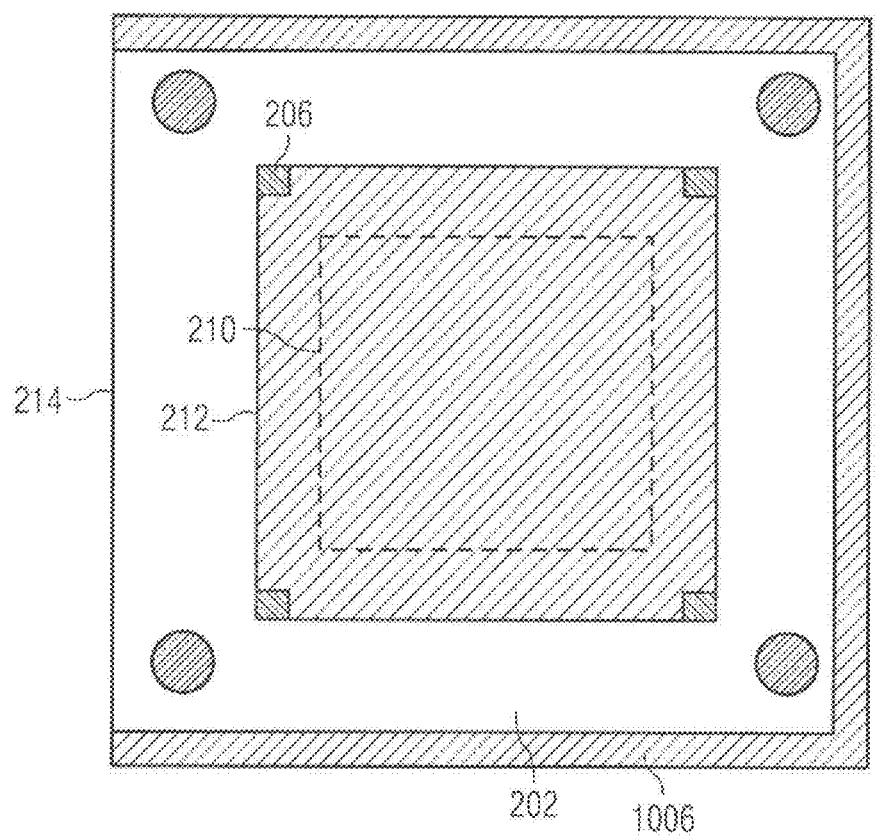
Figure 10D:
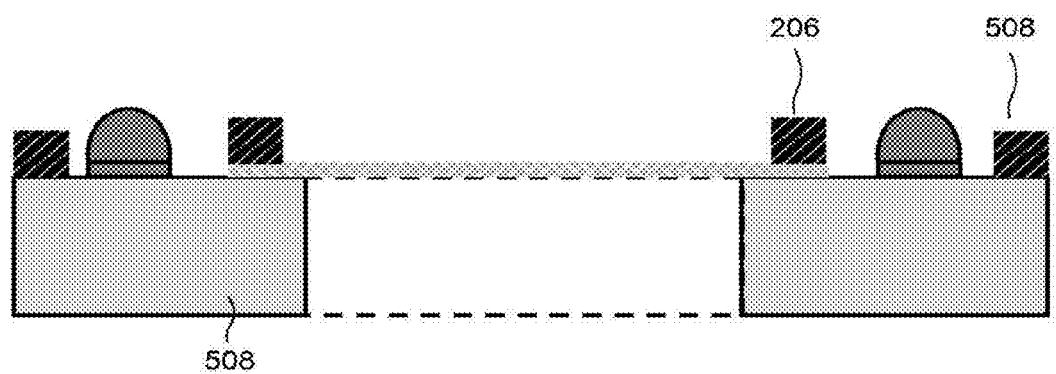

According to various embodiments, as illustrated in FIG. 8 and FIG. 9, the at least one passage hole 510 may be provided through a portion of the support structure 508.

According to various embodiments, as illustrated in FIG. 10A through FIG. 10D, the at least one passage hole 510 may be provided through a portion of the covering layer 506 that may be substantially perpendicular to the top surface 508a of the support structure 508 and the sealing layer 512 may be arranged between the interior surface 506b of the covering layer 506 and a portion of a surface of the first substrate 202 which may be substantially perpendicular to the top surface 508a of the support structure 508. The sealing layer 512 may be arranged between the interior surface 506b of the covering layer 506 and a portion of a surface of the second substrate 302 which may be substantially perpendicular to the top surface 508a of the support structure 508.

According to various embodiments, porting channels 1002 may be formed in the first substrate 202 and the second substrate 302. Porting channels 1002 may allow the first back-volume 520 and the second back-volume 522 to have the same atmospheric pressure. According to various embodiments, porting channels 1002 may combine and/or join the first back-volume 520 and the second back-volume 522 to create a third back-volume 1004.

A further spacer structure 1006 (in addition to the at least one spacer structure 206) may be formed on the top surface 202a of the first substrate 202. The further spacer structure 1006 may be formed at an edge region of the top surface 202a of the first substrate 202, e.g. between an outer edge 212 of the first void 210 (which may be an edge of the void 210 that defines the perimeter of the first void 210) and an outer edge 214 (which may be an edge of the top surface 202a that defines the perimeter of the top surface 202a) of the top surface 202a of the first substrate 202.

According to various embodiments, as illustrated in FIG. 11, a method 1100 of forming a sensor structure is disclosed. The method may include, in 1102, forming a first suspended structure. According to various embodiments, in 1104, the method 1100 may further include forming a second suspended structure disposed from the first suspended structure to form a volume. Further, in 1104, the method 1100 may further include arranging the first suspended structure and the second suspended structure relative to each other such that a received pressure wave entering the volume between the first suspended structure and the second suspended structure generates a displacement of the first suspended structure to a first direction and a displacement of the second suspended structure to a second direction different from the first direction.

According to various embodiments, as illustrated in FIG. 12, a change in the distance between a first membrane 1202 and a second membrane 1204 may cause a change in the capacitance generated between the membranes 1202 and 1204, respectively. According to various embodiments, this change in capacitance may be detected by an electrical capacitance detecting circuit 1210. It is to be noted that some of the components shown in FIG. 12 may be similar to the components shown in FIG. 1. With respect to the same components, the repeated description of the respective components is omitted and it is referred to the description thereof with respect to FIG. 1.

Figure 13:
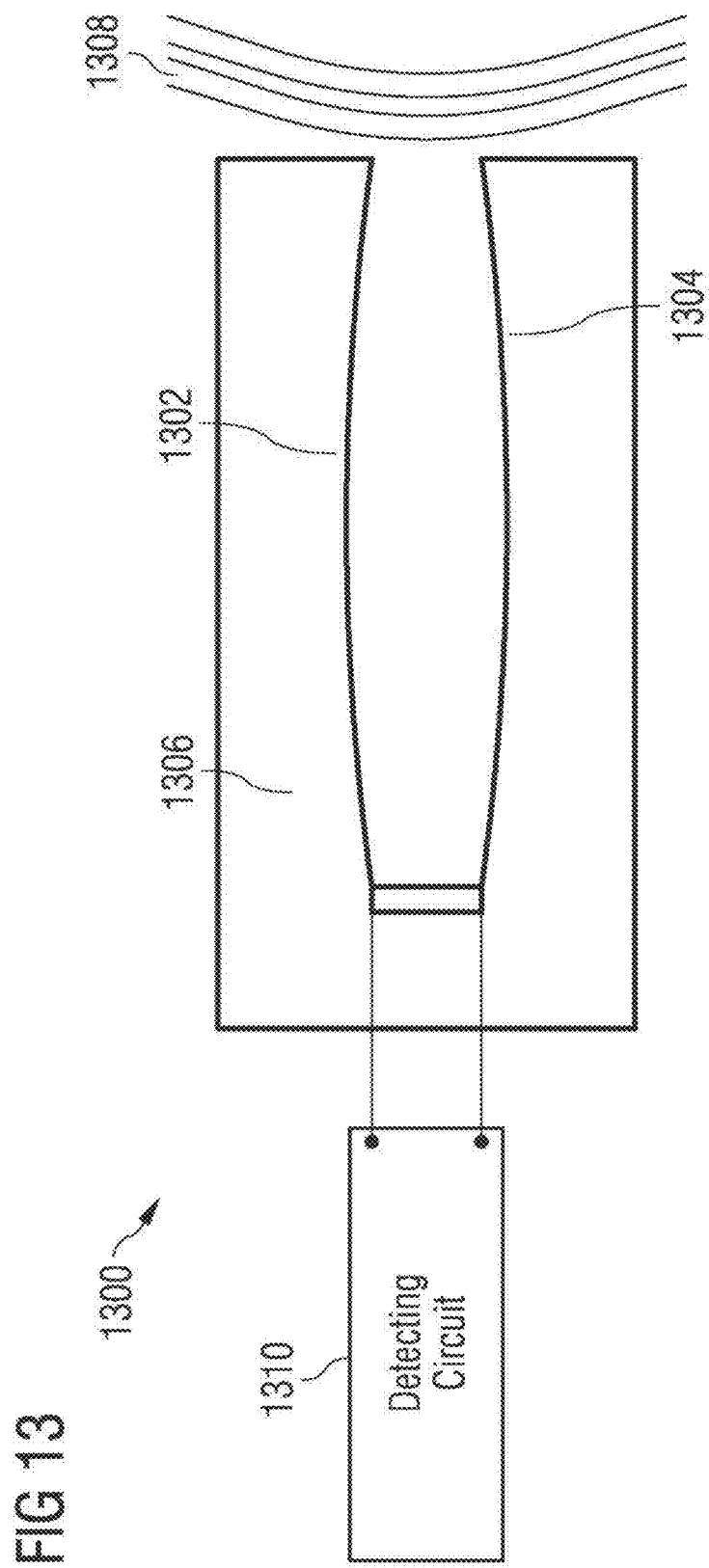
FIG. 13 shows a perspective cross-sectional view of a double diaphragm sensor structure and a circuit configured to optically detect a deflection generated in at least one of the diaphragm structures by an incident pressure wave in accordance with various embodiments.

According to various embodiments, as illustrated in FIG. 13 a change in the distance between the first membrane 1302 and the second membrane 1304 may be measured through various optical detection means, e.g. interferometry, by the optical detection circuit 1310. According to various embodiments, the optical detection circuit 1310 may be implemented as or may contain various combination of optical detection means, e.g. planar lightwave circuitry, laser Doppler vibrometer (LDV), etc. Measuring a change in the distance between the first membrane 1302 and the second membrane 1304 optically may allow the change in distance to be measured more precisely that through other means, e.g. capacitive detection means. In various embodiments, optical detection means may be more resistant to extreme variations in temperature and may be less sensitive to certain kinds of electrical interference, e.g. electromagnetic interference (EMI). It is to be noted that some of the components shown in FIG. 13 may be similar to the components shown in FIG. 1. With respect to the same components, the repeated description of the respective components is omitted and it is referred to the description thereof with respect to FIG. 1.

Figure 14:
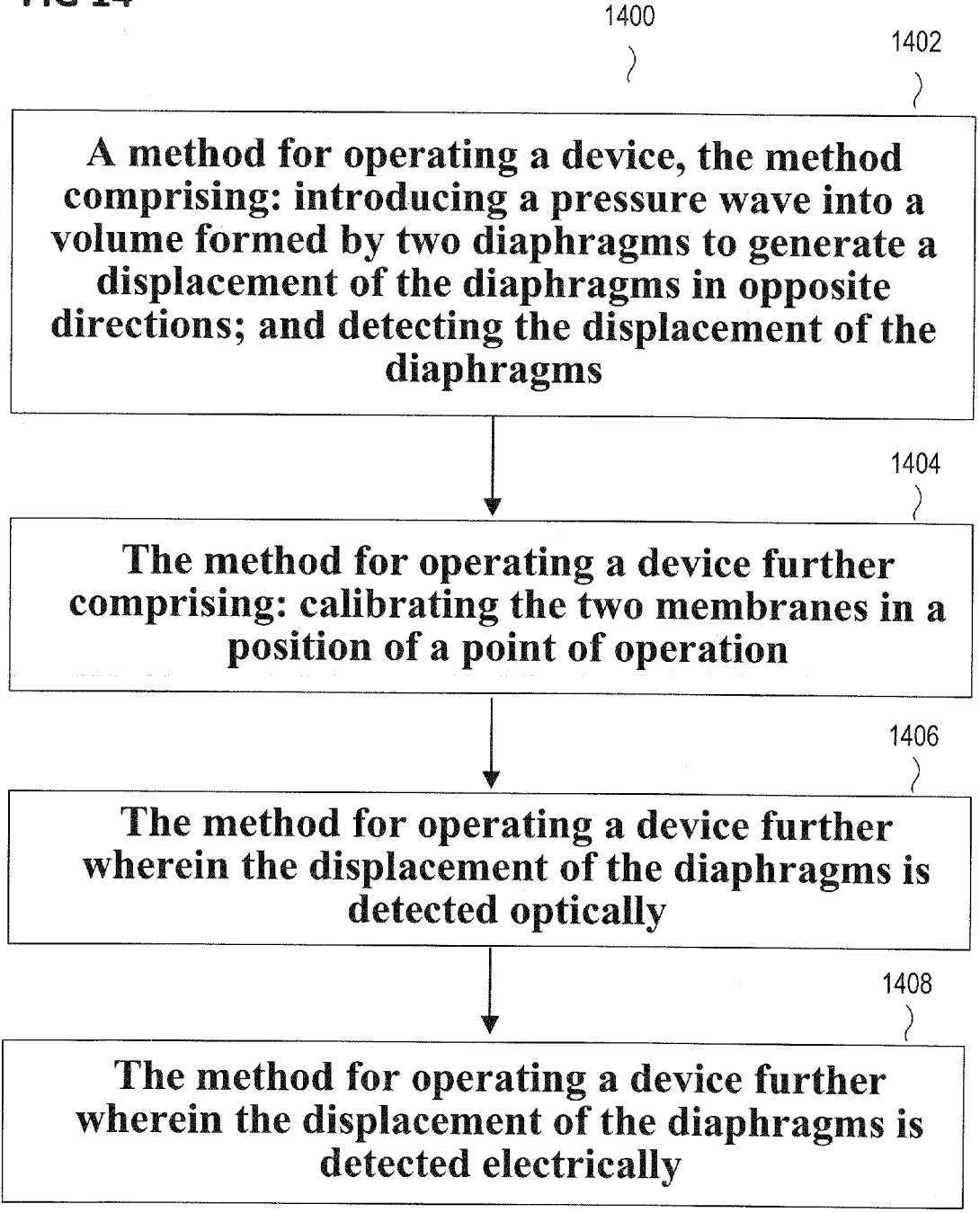
FIG. 14 is a flow diagram of a process for operating a double diaphragm sensor structure according to various embodiments.

According to various embodiments as illustrated in FIG. 14, a method 1400 for operating a device is disclosed. The method 1400 may include, in 1402, introducing a pressure wave into a volume formed by two membranes to generate a displacement of the membranes in opposite directions and detecting the displacement of the membranes. According to various embodiments, the displacement may be detected by comparing a first displacement of a first membrane in a first direction with a second displacement of a second membrane in a second direction opposite the first direction. According to various embodiments, in 1404, the method 1400 may further include calibrating the two membranes in a position of a point of operation. In various embodiments, the point of operation may be an optimum calibration point, e.g. a resonant point defined by the relation $L=n*lambda/4$. According to various embodiments, in 1406, the displacement of the membranes may be detected optically. According to various embodiments, in 1408, the displacement of the membranes may be detected electrically, e.g. capacitively.

In various embodiments, a sensor structure is provided. The sensor structure may include a first suspended structure; a second suspended structure disposed from the first suspended structure to form a volume; wherein the first suspended structure and the second suspended structure are arranged relative to each other such that a received pressure wave entering the volume between the first suspended structure and the second suspended structure generates a displacement of the first suspended structure to a first direction and a displacement of the second suspended structure to a second direction different from the first direction.

In various embodiments, the first suspended structure may include a first membrane. Furthermore, the second suspended structure may include a second membrane. Moreover, the sensor structure may further include a first carrier carrying the first suspended structure. In various embodiments, a surface of the first suspended structure may be fixed to a surface of the first carrier. In various embodiments, the sensor structure may further include at least one bump electrode structure formed on a surface of the first carrier. The first suspended structure may electrically be coupled to the at least one bump electrode structure. Further, the sensor structure may further include at least one spacer structure formed on a surface of the first suspended structure. In various embodiments, the sensor structure may further include a void formed in the first carrier. The first suspended structure may be suspended across the void in the first carrier. Moreover, the first carrier may include a first micro-electro-mechanical system. Furthermore, the sensor structure may further include a second carrier carrying the second suspended structure. In various embodiments, a surface of the second suspended structure may be fixed to a surface of the second carrier. In various embodiments, the sensor structure may further include a void formed in the second carrier. The second suspended structure may be suspended across the void in the second carrier. In various embodiments, the sensor structure may further include at least one contact pad formed on a surface of the second carrier. In various embodiments, the second suspended structure may electrically be coupled to the at least one contact pad. The sensor structure may further include at least one bump electrode structure formed on a surface of the first carrier; wherein the at least one bump electrode structure is electrically coupled to the at least one contact pad. The second carrier may include a second micro-electro-mechanical system. The first suspended structure and the second suspended structure may be connected by the at least one spacer structure.

In various embodiments, a sensor structure arrangement is provided. The sensor structure arrangement may include a sensor structure, which may include a first suspended structure; a second suspended structure disposed from the first suspended structure to form a volume; wherein the first suspended structure and the second suspended structure are arranged relative to each other such that a received pressure wave entering the volume between the first suspended structure and the second suspended structure generates a displacement of the first suspended structure to a first direction and a displacement of the second suspended structure to a second direction different from the first direction. In various embodiments, the sensor structure arrangement may include a circuit coupled to the sensor structure and configured to capacitively measure the displacement of the suspended structures. In various embodiments, the sensor structure arrangement may include a circuit coupled to the sensor structure where the circuit may be an optical detector configured to optically detect the displacement. The sensor structure arrangement may further include a support structure attached to a surface of the sensor structure. In various embodiments, the support structure may include a printed circuit board. In various embodiments, the sensor structure arrangement may further include a covering layer attached to the support structure; wherein the covering layer encloses the sensor structure. In various embodiments, the covering layer and the support structure may be arranged to form a back-volume. In various embodiments, the covering layer has at least one passage hole. In various embodiments, the first suspended structure and the covering layer may form a first back-volume and the second suspended structure and the support structure form a second back-volume.

According to various embodiments, a method for operating a device is disclosed. The method may include introducing a pressure wave into a volume formed by two diaphragms to generate a displacement of the diaphragms in opposite directions; and detecting the displacement of the diaphragms. In various embodiments, the displacement of the diaphragms may be detected by comparing a first displacement of a first diaphragm of the two diaphragms in a first direction with a second displacement of a second diaphragm of the two diaphragms in a second direction opposite the first direction. According to various embodiments, the displacement of the diaphragms may be detected optically. According to various embodiments, the displacement of the diaphragms may be detected electrically. According to various embodiments, the method may further include calibrating the two diaphragms in a position of a point of operation.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A sensor structure, comprising:
a first carrier comprising a void;
a first suspended structure suspended laterally across the void of the first carrier;
a second suspended structure disposed from the first suspended structure;
at least one spacer structure formed on a surface of the first suspended structure, wherein the first suspended structure and the second suspended structure are connected by the at least one spacer structure so that the at least one spacer structure and the first and second suspended structures define boundaries enclosing an unoccupied volume between the first suspended structure and the second suspended structure, the unoccupied volume having a lateral extension at least as long as the void, wherein the unoccupied volume and the void are separated by the first suspended structure;
wherein the first suspended structure and the second suspended structure are arranged relative to each other such that a received pressure wave entering the volume between the first suspended structure and the second suspended structure generates a displacement of the first suspended structure to a first direction and a displacement of the second suspended structure to a second direction different from the first direction.

2. The sensor structure of claim 1,
wherein the first suspended structure comprises a first diaphragm.

3. The sensor structure of claim 1,
wherein the second suspended structure comprises a second diaphragm.

4. The sensor structure of claim 1,
wherein a surface of the first suspended structure is fixed to a surface of the first carrier.

5. The sensor structure of claim 1, further comprising:
at least one bump electrode structure formed on a surface of the first carrier.

6. The sensor structure of claim 5,
wherein the first suspended structure is electrically coupled to the at least one bump electrode structure.

7. The sensor structure of claim 1,
wherein the first carrier comprises a first micro-electro-mechanical system.

8. The sensor structure of claim 1, further comprising:
a second carrier carrying the second suspended structure.

9. The sensor structure of claim 8,
wherein a surface of the second suspended structure is fixed to a surface of the second carrier.

10. The sensor structure of claim 8, further comprising:
a void formed in the second carrier.

11. The sensor structure of claim 10,
wherein the second suspended structure is suspended across the void in the second carrier.

12. The sensor structure of claim 8, further comprising:
at least one contact pad formed on a surface of the second carrier.

13. The sensor structure of claim 12,
wherein the second suspended structure is electrically coupled to the at least one contact pad.

14. The sensor structure of claim 12, further comprising:
at least one bump electrode structure formed on a surface of the first carrier;
wherein the at least one bump electrode structure is electrically coupled to the at least one contact pad.

15. The sensor structure of claim 8,
wherein the second carrier comprises a second micro-electro-mechanical system.

16. A sensor structure arrangement, comprising:
a sensor structure, comprising:
 a first carrier comprising a void;
 a first suspended structure suspended laterally across the void of the first carrier;
 a second suspended structure disposed from the first suspended structure;
 a spacer structure formed on a surface of the first suspended structure, wherein the spacer structure and the first and second suspended structures define boundaries enclosing an unoccupied volume between the first suspended structure and the second suspended structure, the unoccupied volume having a lateral extension at least as long as the void, wherein the unoccupied volume and the void are separated from each other by at least the first suspended structure;
 wherein the first suspended structure and the second suspended structure are arranged relative to each other such that a received pressure wave entering the volume between the first suspended structure and the second suspended structure generates a displacement of the first suspended structure to a first direction and a displacement of the second suspended structure to a second direction different from the first direction; and a circuit coupled to the sensor structure and configured to capacitively measure the displacement.

17. A sensor structure arrangement, comprising:
a sensor structure, comprising:
  a first carrier comprising a void;
  a first suspended structure suspended laterally across the void of the first carrier;
  a second suspended structure disposed from the first suspended structure;
  a spacer structure formed on a surface of the first suspended structure, wherein the spacer structure and the first and second suspended structures define boundaries enclosing an unoccupied volume between the first suspended structure and the second suspended structure, the unoccupied volume having a lateral extension at least as long as the void, wherein the unoccupied volume and the void are separated from each other by at least the first suspended structure;
  wherein the first suspended structure and the second suspended structure are arranged relative to each other such that a received pressure wave entering the volume between the first suspended structure and the second suspended structure generates a displacement of the first suspended structure to a first direction and a displacement of the second suspended structure to a second direction different from the first direction; and
an optical detector configured to optically detect the displacement.

18. A sensor structure arrangement, comprising:
a sensor structure, comprising:
  a first carrier comprising a void;
  a first suspended structure;
  a second suspended structure disposed from the first suspended structure;
  a spacer structure formed on a surface of the first suspended structure, wherein the spacer structure and the first and second suspended structures define boundaries enclosing an unoccupied volume between the first suspended structure and the second suspended structure, the unoccupied volume having a lateral extension at least as long as the void, wherein the unoccupied volume and the void are separated from each other by at least the first suspended structure;
  wherein the first suspended structure and the second suspended structure are arranged relative to each other such that a received pressure wave entering the volume between the first suspended structure and the second suspended structure generates a displacement of the first suspended structure to a first direction and a displacement of the second suspended structure to a second direction different from the first direction;
a support structure attached to a surface of the sensor structure.

19. The sensor structure arrangement of claim 18,
wherein the support structure comprises a printed circuit board.

20. The sensor structure arrangement of claim 18,
wherein the support structure has at least one passage hole.

21. The sensor structure arrangement of claim 18, further comprising:
  a covering layer attached to the support structure;
  wherein the covering layer encloses the sensor structure.

* * * * *